United States Patent
Roeder et al.

[11] Patent Number: 5,876,503
[45] Date of Patent: Mar. 2, 1999

[54] MULTIPLE VAPORIZER REAGENT SUPPLY SYSTEM FOR CHEMICAL VAPOR DEPOSITION UTILIZING DISSIMILAR PRECURSOR COMPOSITIONS

[75] Inventors: Jeffrey Roeder, Brookfield; Peter C. Van Buskirk, Newtown, both of Conn.

[73] Assignee: Advanced Technology Materials, Inc., Danbury, Conn.

[21] Appl. No.: 758,599

[22] Filed: Nov. 27, 1996

[51] Int. Cl.⁶ ................................................. C23C 16/00
[52] U.S. Cl. ........................ 118/715; 118/726; 427/255.2
[58] Field of Search .................................. 118/726, 715; 427/255.2, 255.3

[56] References Cited

U.S. PATENT DOCUMENTS

| | | | |
|---|---|---|---|
| 476,274 | 6/1892 | Huck . | |
| 2,490,547 | 12/1949 | Schraner et al. | 219/39 |
| 2,622,184 | 12/1952 | Johneas | 219/38 |
| 2,801,322 | 7/1957 | Wetherill | 219/39 |
| 2,925,329 | 2/1960 | Yost | 23/281 |
| 3,190,262 | 6/1965 | Bakish et al. | 118/48 |
| 3,404,873 | 10/1968 | Orens | 261/141 |
| 3,520,416 | 7/1970 | Keedwell | 210/490 |
| 3,549,412 | 12/1970 | Frey, Jr. et al. | 117/100 |
| 3,659,402 | 5/1972 | Alliger | 55/233 |
| 3,823,926 | 7/1974 | Bracich | 261/106 |
| 3,969,449 | 7/1976 | Shires et al. | 261/153 |
| 4,036,915 | 7/1977 | Lucero et al. | 261/104 |
| 4,080,926 | 3/1978 | Platakis et al. | 118/5 |

(List continued on next page.)

FOREIGN PATENT DOCUMENTS

| | | |
|---|---|---|
| 0 058 571 | 8/1982 | European Pat. Off. . |
| 0 328 333 | 8/1989 | European Pat. Off. . |
| 0 405 634 A2 | 1/1991 | European Pat. Off. . |
| 370473 | 3/1923 | Germany . |
| 58-125633 | 7/1983 | Japan . |
| WO93/04072 | 3/1993 | WIPO . |
| 94/14530 | 7/1994 | WIPO . |

OTHER PUBLICATIONS

"Integrated Systems Approach Based on DLI," Bulletin LPDS–Dec. 1994, copright 1994, MKS Instruments, Inc.

"Direct Liquid Injection Sub–System—DLI–25B," Bulletin DLI–Dec. 1994, copyright 1994, MKS Instruments, Inc.

Singh R.K., et al., "In situ processing of eptiaxial Y–Ba–Cu–O high Tc superconducting films on (100) $SrTiO_3$ and (100) $YS-ZrO_2$ substrates at 500°–650° C.," App. Phys. Lett. 54(22), 29 May 1989, pp. 2271–2273.

Yoshitake, T., et al., "As–grown superconducting Bi–Sr–Ca–Cu–O thin films by coevaporation," App. Phys. Lett. 55(7), 14 Aug. 1989, pp. 702–704.

Erbil, A., et al., "A Review of Metalorganic Chemical Vapor Deposition of High–Temperature Superconducting Thin Films," SPIE vol. 1187 Processing of Films for High Tc Superconducting Electronics (1989), 104–109.

Kirlin, Peter S., et al., "Growth of high Tc YBaCuO thin films by metalorganic chemical vapor deposition," SPIE vol. 1187 Processing of Films for High Tc Superconducting Electronics (1989), 115–127.

(List continued on next page.)

*Primary Examiner*—R. Bruce Breneman
*Assistant Examiner*—Jeffrie R Lund
*Attorney, Agent, or Firm*—Steven J. Hultquist; Oliver A. M. Zitzmann

[57] ABSTRACT

A system for the deposition of a multicomponent material layer on a substrate from respective liquid precursors for components of the multicomponent material layer, comprising: a vapor deposition zone; and multiple vaporizer units, each of which is joined (i) to at least one source of liquid precursor for supplying at least one liquid precursor thereto, and (ii) in vapor flow communication with the vapor deposition zone arranged to retain the substrate therein, for deposition on the substrate of vapor phase species from precursor vapor formed by vaporization of liquid precursors in the vaporizer units of the system.

10 Claims, 3 Drawing Sheets

OTHER PUBLICATIONS

Zama, H., et al., "Properties of Metalorganic Precursors for Chemical Vapor Deposition of Oxide Superconductors," Japanese Journal of Applied Physics, 29(7), Jul. 1990, pp. L1072–L1074.

Gardiner. R., et al., "Volatile Barium β–Diketonate Polyether Adducts. Synthesis, Characterization, and Metallorganic Chemical Vapor Deposition," Chem. Mater., 3(6), 1991, pp. 1053–1059.

Derwent Citation, Dec. 11, 1989, Japan—abstract of JP1305813, abstract only.

Lackey, W.J., et al., "Rapid chemical vapor deposition of superconducting $YBa_2Cu_3O_x$," Appl. Phys. Lett. 56(12), 19 Mar. 1990, pp. 1175–1177.

Turnipseed, S.B., et al., "Synthesis and Characterization of Alkaline–Earth–Metal β–Diketonate Complexes Used as Precursors for Chemical Vapor Deposition of Thin–Film Superconductors," Inorg. Chem. 1991, 30(6), 1164–1170.

Hiskes, R., et al., "Single source metalorganic chemical vapor deposition of low microwave surface resistance $YBa_2Cu_3O_7$," Appl. Phys. Lett. 59(5), 29 Jul. 1991, pp. 606–607.

Zhang, J., et al., "Plasma Enhanced Metalorganic Chemical Vapor Deposition of Conductive Oxide Electrodes for Ferroelectric $BaTiO_3$ Capacitors," Mat. Res. Soc. Symp. Proc., vol. 310, 1993, pp. 249–254.

Van Buskirk, P., et al., "MOCVD Growth of $BaTiO_3$ in an 8" Single–Wafer CVD Reactor, Proceedings of ISAF92, in press (1992), 3 pages.

Zhang, J., et al., "Single liquid source plasma–enhanced metalorganic chemical vapor deposition of high–quality $YBa_2Cu_3O_{7-x}$ thin films," Appl. Phys. Lett. 61(24), 14 Dec. 1992, pp. 2884–2886.

Panson, A.J., et al., "Chemical vapor deposition of $YBa_2Cu_3O_7$ using metalorganic chelate precursors," Appl. Phys. Lett. 53(18), 31 Oct. 1988, pp. 1756–1757.

Scarsbrook, G., et al., "Low temperture pulsed plasma deposition. Part I–a new technique for thin film deposition with complete gas dissociation," Vacuum, 38(8–10), 1988, pp. 627–631.

U.S. PATENT DOCUMENTS

| | | | |
|---|---|---|---|
| 4,288,396 | 9/1981 | Ottestad | 261/128 |
| 4,529,427 | 7/1985 | French | 65/3.12 |
| 4,822,636 | 4/1989 | Saitoth et al. | 427/69 |
| 4,833,976 | 5/1989 | Loland | 92/86.5 |
| 4,842,893 | 6/1989 | Yializis et al. | 427/44 |
| 4,844,006 | 7/1989 | Page, Jr. et al. | 118/719 |
| 4,847,469 | 7/1989 | Hofmann et al. | 219/273 |
| 4,954,371 | 9/1990 | Yializis | 427/44 |
| 5,034,372 | 7/1991 | Matsuno et al. | 505/1 |
| 5,097,800 | 3/1992 | Shaw et al. | 118/730 |
| 5,098,741 | 3/1992 | Nolet et al. | 427/248.1 |
| 5,110,622 | 5/1992 | Hasegawa et al. | 427/126.1 |
| 5,120,703 | 6/1992 | Snyder et al. | 505/1 |
| 5,139,999 | 8/1992 | Gordon et al. | 505/1 |
| 5,165,960 | 11/1992 | Platts | 427/166 |
| 5,204,314 | 4/1993 | Kirlin et al. | 505/1 |
| 5,225,561 | 7/1993 | Kirlin et al. | 546/256 |
| 5,248,787 | 9/1993 | Timmer et al. | 549/206 |
| 5,259,995 | 11/1993 | Matalis | 261/107 |
| 5,280,012 | 1/1994 | Kirlin et al. | 505/1 |
| 5,376,409 | 12/1994 | Kaloyeros et al. | 427/248.1 |
| 5,447,909 | 9/1995 | Takahashi et al. | 505/447 |
| 5,536,323 | 7/1996 | Kirlin et al. | 118/726 |
| 5,618,580 | 4/1997 | Oshima et al. | 414/212 |
| 5,620,524 | 4/1997 | Fan et al. | 118/726 |
| 5,690,743 | 11/1997 | Murakami et al. | 118/715 |
| 5,711,816 | 1/1998 | Kirlin et al. | 118/726 |
| 5,719,417 | 2/1998 | Roeder et al. | 257/295 | ns such as $Ta_2O_5$ are coming into expanded use in the microelectronics industry; $Ta_2O_5$ is envisioned as a thin-film capacitor material whose use may enable higher density memory devices to be fabricated.

MULTIPLE VAPORIZER REAGENT SUPPLY SYSTEM FOR CHEMICAL VAPOR DEPOSITION UTILIZING DISSIMILAR PRECURSOR COMPOSITIONS

CROSS-REFERENCE TO RELATED APPLICATION

This application is concurrently filed on Nov. 27, 1996 with U.S. Pat. No. 5,719,417 issued Feb. 17, 1998 to J. Roeder et al. in the names of Jeff Roeder and Peter Van Buskirk for "Controlled Orientation of Ferroelectric Layers."

BACKGROUND OF THE INVENTION

1. Field of the Invention

This invention relates generally to an apparatus and method for delivery and vaporization of liquid reagents for transport to a deposition zone, e.g., a chemical vapor deposition (CVD) reactor. More specifically, the invention relates to a reagent supply system for chemical vapor deposition using dissimilar precursor compositions.

2. Description of the Related Art

In the formation of thin films, layers and coatings on substrates, a wide variety of source materials have been employed. These source materials include reagents and precursor materials of widely varying types, and in various physical states. To achieve highly uniform thickness layers of a conformal character on the substrate, vapor phase deposition has been used widely as a technique. In vapor phase deposition, the source material may be of initially solid form which is sublimed or melted and vaporized to provide a desirable vapor phase source reagent. Alternatively, the reagent may be of normally liquid state, which is vaporized, or the reagent may be in the vapor phase in the first instance.

In the manufacture of advanced thin film materials, a variety of reagents may be used. These reagents may be used in mixture with one another in a multicomponent fluid which is utilized to deposit a corresponding multicomponent or heterogeneous film material. Such advanced thin film materials are increasingly important in the manufacture of microelectronic devices and in the emerging field of nanotechnology. For such applications and their implementation in high volume commercial manufacturing processes, it is essential that the film morphology, composition, and stoichiometry be closely controllable. This in turn requires highly reliable and efficient means and methods for delivery of source reagents to the locus of film formation.

Examples of advanced thin film materials include refractory materials such as high temperature superconducting (HTSC) materials including $YBa_2Cu_3O_x$; wherein x is from about 6 to 7.3, the bismuth-strontium-calcium-copper oxide and thallium-barium-calcium-copper oxide superconductors of varying stoichiometry, abbreviated BiSrCaCuO and TlBaCaCuO. Barium titanate, $BaTiO_3$, and barium strontium titanate, $Ba_xSr_{1-x}TiO_3$, have been identified as ferroelectric and photonic materials with unique and potentially very useful properties in thin film applications of such materials. $Ba_xSr_{1-x}Nb_2O_6$ is a photonic material whose index of refraction changes as a function of electric field and also as a function of the intensity of light upon it. Lead zirconate titanate, $PbZr_{1-x}Ti_xO_3$, is a ferroelectric material whose properties are very interesting. The Group II metal fluorides, $BaF_2$, $CaF_2$, and $SrF_2$, are useful for scintillation detecting and coating of optical fibers. Refractory oxides such as $Ta_2O_5$ are coming into expanded use in the microelectronics industry; $Ta_2O_5$ is envisioned as a thin-film capacitor material whose use may enable higher density memory devices to be fabricated.

Thin films comprising the Group II metal fluorides, $BaF_2$, $CaF_2$, and $SrF_2$, are potentially very useful as buffer layers for interfacing between silicon substrates and HTSC or GaAs overlayers or between GaAs substrates and HTSC or silicon overlayers, and combinations of two or all of such metal fluorides may be employed in forming graded compositions in interlayers providing close lattice matching at the interfaces with the substrate and overlayer constituents of the composite. For example, a silicon substrate could be coated with an epitaxial layer of $BaF_2/CaF_2$, $SrF_2/CaF_2$, or $SrF_2/CaF_2/BaF_2$, whose composition is tailored for a close lattice match to the silicon. If the ratio of the respective Group II metal species in the metal fluoride interlayers can be controlled precisely in the growth of the interlayer, the lattice constant could be graded to approach the lattice constant of GaAs. Thus, a gallium arsenide epitaxial layer could be grown over the metal fluoride interlayer, allowing the production of integrated GaAs devices on widely available, high quality silicon substrates. Another potential use of such type of metal fluoride interlayers would be as buffers between silicon substrates and polycrystalline HTSC films for applications such as non-equilibrium infrared detectors. Such an interlayer would permit the HTSC to be used in monolithic integrated circuits on silicon substrates.

$BaTiO_3$ and $Ba_xSr_{1-x}Nb_2O_6$ in film or epitaxial layer form are useful in photonic applications such as optical switching, holographic memory storage, and sensors. In these applications, the $BaTiO_3$ or $Ba_xSr_{1-x}Nb_2O_6$ film is the active element. The related ferroelectric material $PbZr_{1-x}Ti_xO_3$ is potentially useful in infrared detectors and thin film capacitors well as filters and phase shifters.

In these and other applications involving the manufacture of microcircuitry and microelectronic devices, there is a growing use of new thin film materials and corresponding precursors to fabricate products. This trend is accompanied by the evolution towards increasingly smaller microelectronic feature sizes, in which chemical vapor deposition (CVD) is often the preferred deposition technique because of the conformality, composition control, deposition rates and microstructural homogeneity that are characteristic of such method.

Chemical vapor deposition (CVD) is a particularly attractive method for forming thin film materials of the aforementioned types, because it is readily scaled up to production runs and because the electronic industry has a wide experience and an established equipment base in the use of CVD technology which can be applied to new CVD processes. In general, the control of key variables such as stoichometry and film thickness, and the coating of a wide variety of substrate geometries is possible with CVD. Forming the thin films by CVD permits the integration of these materials into existing device production technologies CVD also permits the formation of layers of the refractory materials that are epitaxially related to substrates having close crystal structures.

CVD requires that the element source reagents, i.e., the precursor compounds and complexes containing the elements or components of interest must be sufficiently volatile to permit gas phase transport into the chemical vapor deposition reactor. The elemental component source reagent must decompose in the CVD reactor to deposit only the desired element at the desired growth temperatures. Premature gas phase reactions leading to particulate formation must not occur, nor should the source reagent decompose in the lines before reaching the reactor deposition chamber. When compounds are desired to be deposited, obtaining optimal properties requires close control of stoichiometry which can be achieved if the reagent can be delivered into the reactor in a controllable fashion. In this respect the reagents must not be so chemically stable that they are non-reactive in the deposition chamber.

Desirable CVD reagents therefore are fairly reactive and volatile. Unfortunately, for many of the refractive materials described above, volatile reagents do not exist. Many potentially highly useful refractory materials have in common that one or more of their components are elements, i.e., the Group II metals barium, calcium, or strontium, or the early transition metals zirconium or hafnium, for which no or few volatile compounds well-suited for CVD are known. In many cases, the source reagents are solids whose sublimation temperature may be very close to the decomposition temperature, in which case the reagent may begin to decompose in the lines before reaching the reactor, and it therefore is very difficult to control the stoichiometry of the deposited films from such decomposition-susceptible reagents.

When the film being deposited by CVD is a multicomponent substance rather than a pure element, such as barium titanate, lead zirconate titanate (PZT), lead lanthanum titanate (PLT), or the oxide superconductors, controlling the stoichiometry of the film is critical to obtaining the desired film properties. In the deposition of such materials, which may form films with a wide range of stoichiometries, the controlled delivery of known proportions of the source reagents into the CVD reactor chamber is essential.

In other cases, the CVD reagents are liquids, but their delivery into the CVD reactor in the vapor phase has proven difficult because of problems of premature decomposition or stoichiometry control. Examples include the deposition of tantalum oxide from the liquid source tantalum ethoxide and the deposition of titanium nitride from bis(dialkylamide) titanium reagents.

In recent years it has been widely recognized that for many of these emerging new thin film materials, there are no well-behaved gaseous precursors available (at ambient temperature and pressure). In such instances, the liquid delivery technique has become the predominant method of choice to controllably deliver liquid and solid precursors (typically metalorganic compounds) to a CVD process.

In the liquid delivery approach, the liquid or solid precursor is typically dissolved in a solvent, and the solution is stored, e.g., at ambient temperature and pressure. When the deposition process is to be run, the solution is transported to a high temperature vaporization zone within the CVD flow system, where the precursor is flash vaporized (along with the solvent), and the gas-phase precursor then is transported to the deposition zone, such as a chemical vapor deposition reactor, containing a substrate on which deposition of the desired component(s) from the vapor-phase precursor composition takes place.

The liquid delivery technique has been found to be extremely useful for deposition of multicomponent oxide thin films such as (Ba,Sr)TiO$_3$, SrBi$_2$Ta$_2$O$_9$ (SBT), (Pb,La)TiO$_3$ (PLT) and Pb(Zr, Ti)O$_3$ (PZT) for example. In CVD processes developed for these and other compounds, it is highly desirable to dissolve all the precursors in a single solution, and vaporize them simultaneously, following which the vaporized precursor composition containing the respective components is transported to the deposition chamber, as described above.

Liquid delivery systems of varying types are known in the art, and for example are disclosed in U.S. Pat. No. 5,204,314 issued Apr. 20, 1993 to Peter S. Kirlin et al. and U.S. Pat. 5,536,323 issued Jul. 16, 1996 to Peter S. Kirlin et al., which describe heated foraminous vaporization structures such as microporous disk elements. In use, liquid source reagent compositions are flowed onto the foraminous vaporization structure for flash vaporization. Vapor thereby is produced for transport to the deposition zone, e.g., a CVD reactor. The liquid delivery systems of these patents provide high efficiency generation of vapor from which films may be grown on substrates. Liquid delivery systems of such type are usefully employed for generation of multicomponent vapors from corresponding liquid reagent solutions containing one or more precursors as solutes, or alternatively from liquid reagent suspensions containing one or more precursors as suspended species.

The liquid delivery approach has found widespread application in the CVD formation of BST films, which may for example be carried out with the tetraglyme adduct of bis-tetramethylheptanedionato Ba (Ba(thd)$_2$-tetraglyme, the tetraglyme adduct of bis-tetramethylheptanedionato Sr (Sr (thd$_2$-tetraglyme), and bis-isopropoxy bistetramethylheptanedionato Ti (Ti(OPr)$_2$(thd)$_2$) being dissolved in a solvent that may contain butyl acetate, and with the resulting solution being pumped to a zone where it is vaporized at surfaces that are maintained at a temperature of approximately 230° C. This technique has been found to result in BST films with excellent quality, which possess superior microstructural and functional properties.

The simplicity of such liquid delivery approach for CVD of BST has been fortuitous, because each component in this system of metalorganic precursors can be treated identically in the respective solution-forming, vaporization and transport steps of the process. Thus, in such a compatible system of multiple, well-behaved precursors, (i) the precursors can be dissolved in the same solvent with high solubility, (ii) the precursors maintain their identity in the single solution, without deleterious chemical reactions with the solvent or net ligand exchange with each other, (iii) the precursors can be efficiently vaporized under the same temperature flow, pressure and ambient (carrier) gas conditions, and (iv) the CVD deposition process can be performed using a fixed ratio of the CVD precursors in the solution, distinct advantage since the relative proportions of the respective components cannot be easily quickly changed.

In instances in which the aforementioned criteria (i)–(iv) are not fully met, and the precursors used as source reagents for the various film constituents are dissimilar in their liquid delivery (e.g., solution formation and vaporization) requirements, the use of the conventional liquid delivery system will be correspondingly sub-optimal in terms of the efficiency of the process and the structure and properties of the resulting deposited films.

It therefore is an object of the present invention to provide a liquid delivery. apparatus and process accommodating multiple precursors for deposition formation of a corresponding multicomponent material layer, where the precursors are dissimilar in their liquid delivery requirements.

Other objects and advantages of the invention will be more fully apparent from the ensuing disclosure and appended claims.

SUMMARY OF THE INVENTION

In one aspect, the present invention relates to a system for the deposition of a multicomponent material layer on a substrate from respective liquid precursors for components of the multicomponent material layer, comprising:

a vapor deposition zone; and multiple vaporizer units, each of which is joined (i) to at least one source of liquid precursor for supplying at least one liquid precursor thereto, and (ii) in vapor flow communication with the vapor deposition zone arranged to retain the substrate therein, for deposition on the substrate of vapor phase species from precursor vapor formed by vaporization of liquid precursors in the vaporizer units of the system.

A further aspect of the invention relates to a system for the deposition of a multicomponent material layer on a substrate, such system comprising:

at least one liquid precursor source for at least one but less than all components of the multicomponent material layer;

at least another liquid precursor source for another component of the multicomponent material layer;

a first vaporizer unit joined in flow communication with the at least one liquid precursor source for at least one but less than all components of the multicomponent material layer;

a second vaporizer unit joined in flow communication with the at least another liquid precursor source for another component of the multicomponent material layer;

a vapor deposition unit; and the first and second vaporizer units being joined in vapor flow communication with the vapor deposition unit, whereby the vapor deposition unit receives (i) vapor of at least one liquid precursor source source for at least one but less than all components of the multicomponent material layer from the first vaporizer unit, and (ii) vapor of at least another liquid precursor source for another component of the multicomponent material layer, for deposition of the multicomponent material layer on a substrate disposed in the vapor deposition unit.

Another aspect of the invention relates to a process for forming a multiple component material layer on a substrate by vapor deposition, from multiple liquid phase precursors for components of the material layer to be formed, comprising the steps of:

flowing at least one but less than all of the multiple liquid phase precursors to a first vaporization zone, and vaporizing said flowed precursors therein, to form a first precursor vapor;

flowing at least one other of the multiple liquid phase precursors to a second vaporization zone, and vaporizing said other flowed precursors therein, to form a second precursor vapor; and flowing the first precursor vapor from the first vaporization zone, and the second precursor vapor from the second vaporization zone, to a vapor deposition zone containing the substrate, and depositing the multiple component material layer on the substrate from the first and second precursor vapor.

The foregoing process steps may be carried out repetitively to form a multi-layer, multiple component material layer on the substrate, for example $BaTiO_3/SrTiO_3$ multilayer structures, which may exhibit unique electrical properties, or multiple layer optical coatings which can be designed to achieve unique optical effects, such as high reflectance, for example tantalum oxide/silicon oxide multilayers.

Other aspects, features and embodiments of the invention will be more fully apparent from the ensuing disclosure and appended claims.

DETAILED DESCRIPTION OF THE INVENTION, AND PREFERRED EMBODIMENTS THEREOF

Figure 1:
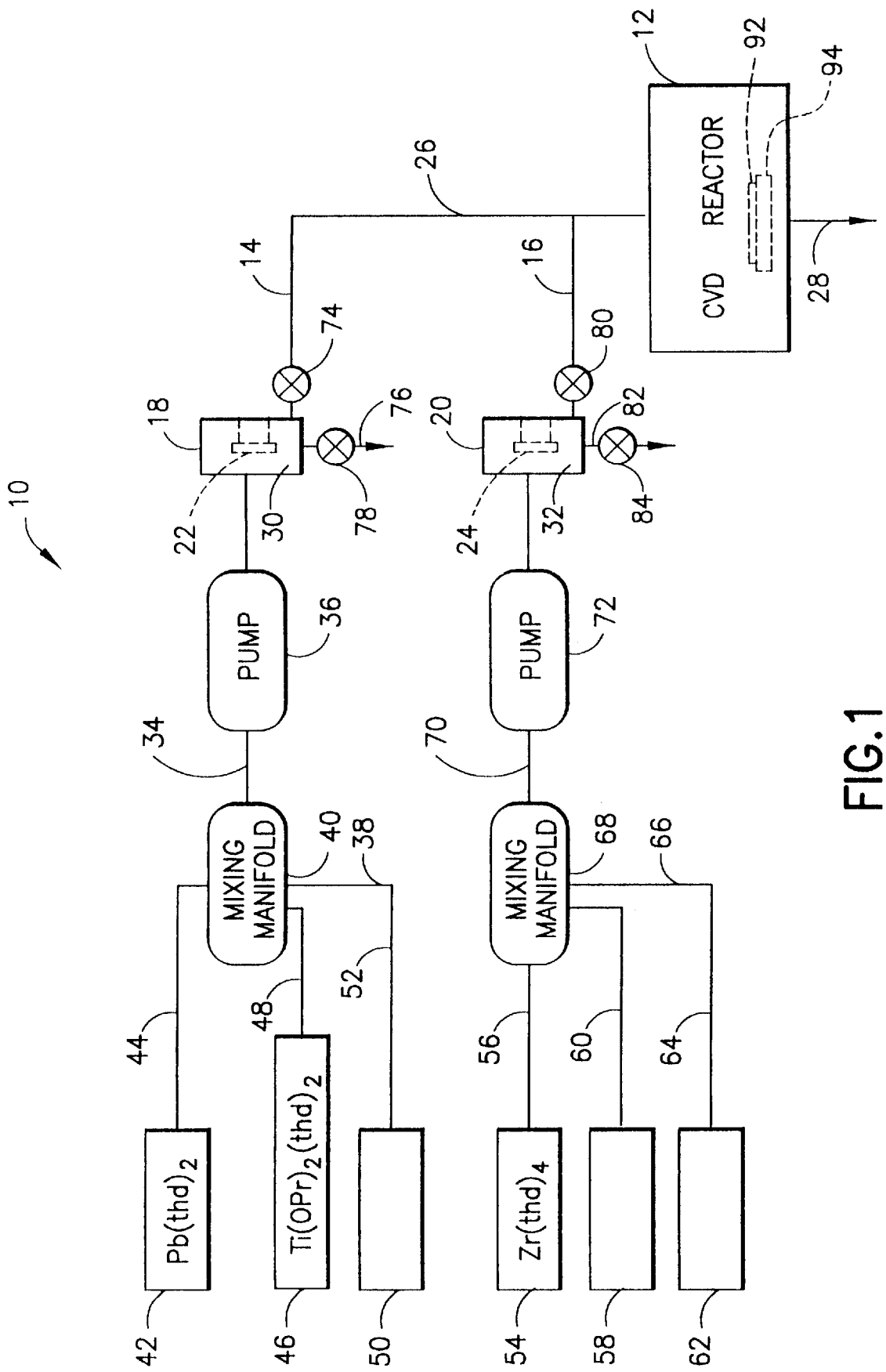
FIG. 1 is a schematic representation of a multiple vaporizer liquid delivery system according to one embodiment of the invention, as employed for a deposition of PZT.

The disclosures of the following patents and applications are hereby incorporated herein in their entirety: U.S. Pat. No. 5,204,314 issued Apr. 20, 1993 to Peter S. Kirlin et al.; U.S. Pat. No. 5,536,323 issued Jul. 16, 1996 to Peter S. Kirlin et al.; U.S. Pat. No. 5,711,816 issued Jan. 27, 1998 to Peter S. Kirlin et al.; and concurrently filed U.S. Pat. No. 5,719,417 issued Feb. 17, 1998 to J. Roeder et al. filed Nov. 27, 1996 in the names of Jeff Roeder and Peter Van Buskirk for "Controlled Orientation of Ferroelectric Layers."

The present invention contemplates a system for the deposition of a multicomponent material layer on a substrate, by the use of multiple vaporizer units, each of which is joined (i) in liquid supply relationship with at least one source of liquid precursor, and (ii) in vapor flow communication with a single vapor deposition zone arranged to hold a substrate for deposition thereon of vapor phase species from precursor vapor formed by vaporization of liquid precursors in the vaporizer units of the system.

The system of the present invention thus accommodates the circumstance in which some or all of the respective precursors employed to form a multicomponent material layer are not fully compatible with one another. For example, optimum vaporization temperatures may differ for various ones of the multiple precursors, or a precursor having high solubility in a particular solvent may be incompatible with another precursor, in the sense that the latter precursor is only poorly soluble in the particular solvent. Alternatively, a specific precursor may be susceptible to deleterious ligand exchange with a solvent which is optimally employed for delivery of another precursor, or else specific precursors for the multicomponent film being formed may be deleteriously cross-reactive with one another.

The invention is particularly usefully employed in instances where the respective precursor components have markedly different vaporization temperatures and the use of a same higher temperature for vaporization of all precursors may lead to decomposition of precursors otherwise vaporizable at lower temperatures and the resulting formation of involatile residues or other disadvantageous decomposition or reaction by-products.

The invention is also particularly usefully employed in CVD processes that use seed layers or other multilayer structures that require fast, simple switching of the precursor gas in order to achieve distinct interfaces between adjacent layers.

The multiple vaporizer unit deposition system of the present invention affords the process designer the advantage of being able to select from a broader range of precursors than has heretofore been possible with a single vaporizer unit deposition system. Such advantage provides correspondingly greater flexibility to optimize certain film properties of the deposited material layer. For example, in the case where there are 3 or more precursors needed (for a ternary oxide, for example) the best available set of precursors may not be compatible in terms of their optimum temperatures for vaporization. In such case, the use of multiple vaporizers will allow different precursors to be vaporized at respective temperatures best suited to maximize the efficacy of the film formation process, and to minimize formation of involatile residues otherwise attributable to the use of sub-optimal temperature (when all precursors are vaporized at a same temperature in the manner of the prior art).

Multiple vaporizer units may also be used to introduce precursors that exchange ligands with each other. In such case, the interactive compounds would be segregated in their own subsections of the liquid delivery system, in their own most appropriate solvents, and they would be vaporized in respective vaporizers that may or may not be at the same temperature or other vaporization conditions. The gas flow system downstream of the vaporizer may be correspondingly designed to minimize interaction of these potentially reactive gas-phase compounds, e.g., by segregating the respective vaporized components spatially from one another until just before their introduction to the deposition zone showerhead or nozzle, or wafer surface in the deposition zone, and/or by segregating the respective vaporized components temporally, by alternately pulsing the flows of the respective precursors prior to their reaching the substrate surface.

The multiple vaporizer deposition system of the invention is also usefully employed when different solvents are needed to contain the respective precursors with high solubility and without deleterious reaction. In certain instances, the stability of one precursor compound may be enhanced by the use of a particular solvent, while the other precursors are deleteriously affected in the presence of that solvent. To resolve such solvent-related problems, different solvents may be employed for the various precursors, and segregation of these solutions in the liquid delivery system is useful to take advantage of the enhancing property of a given solvent for a given precursor solute.

The multiple vaporizer liquid delivery system of the invention also may be employed to change the ratio of precursors present in the gas phase over fairly short time intervals, particularly during the deposition process itself. For example, the presence of a specific substrate surface may require that a different composition film be deposited to nucleate the desired crystal phase, or to control crystalline orientation. In such cases, multiple film compositions could be dynamically achieved during the deposition process by simply switching a second precursor source on or off to effect a change in the film composition. Before or after the change the precursor vapor formed in one or more of the multiple vaporizers could be bypassed in relation to the deposition zone, while the deposition process is continued with other vaporized precursor(s) being flowed to the deposition zone, e.g., chemical vapor deposition reactor.

As an illustrative example of the foregoing advantages, the chemical vapor deposition of $PbZr_{0.40}Ti_{0.60}O_3$, (PZT 40/60) may be carried out with a combination of precursors (from the standpoints of volatility and safety), comprising bis(tetramethylheptanedionato)lead $(Pb(thd)_2)$, tetrakis (tetramethylheptanedionato)zirconium $(Zr(thd)_4)$, and bis (isopropoxy)bis(tetramethylheptanedionato)titanium $(Ti(OPr)_2(thd)_2)$. These compounds are a reasonable choice for deposition of PZT on their own merits, and have been demonstrated to be resistant to deleterious ligand exchange reactions when present in a single liquid solution.

Under certain conditions, the aforementioned Pb and Ti precursor compounds are most efficiently vaporized (including minimization of involatile residue) at 180°–210° C., while the Zr compound is more efficiently vaporized at temperatures in excess of 230° C. Operation at any single temperature will result in less than optimum vaporization characteristics for at least one of the precursor compounds, and involatile residue or insufficient heat for vaporization will inevitably result for at least one precursor under such unitary vaporization condtions.

The net effect of these constraints is an unsatisfactory compromise in vaporization temperature, where either the Pb and Ti metalorganic compounds are decomposed if the temperature is optimized for the Zr compound, or the Zr compound is inefficiently transported if the temperature is lowered to the point where the Pb and Ti compounds transport without decomposition.

This multiple, mutually exclusive optimum process condition problem may be obviated in the use of the present invention, where the Zr precursor (in liquid solution) is held in a separate section of the liquid delivery system, and vaporized as needed, simultaneously with vaporization of the Pb and Ti precursors in a separate section of the process system. The ratio of the gas-phase precursors near the wafer surface could then be controlled by correspondingly adjusting the flow rates of the two solutions to their respective vaporizers, or by appropriate selection of the respective concentrations of the separate precursor solutions, or by adjustment of the vaporizer carrier gas flow, etc. Use of an additional separate vaporizer in such liquid delivery and vaporization system thereby provides a broader range of precursor choices, such as permitting the use of tetrakis-tert butoxy Zr $(Zr(tBu)_4)$, which may react in solution with the other compounds, but which may not interact substantially with those species in the vapor phase, especially at low pressures and in a properly designed process and reactor.

The multiple vaporizer system of the invention may also be employed to incorporate in the PZT film dopant species known to be beneficial to the properties of thin film PZT, for example donor dopants such as La and Nb. In this case, the additional cation species La or Nb) could be introduced by metalorganic precursors therefor, as grouped with either the Pb/Ti compounds or Zr compound according to their respective thermal transport properties.

It will be recognized that the multiple vaporizer system of the present invention may be arranged with any suitable number of vaporizers, as appropriate to the specific deposition species and precursors employed. As discussed above, such deposition species may comprise main component species of the material layer to be formed on a substrate, as well as dopant species employed to impart specific compositional and/or functional properties to the material layer being formed, as well as other vaporized reagents or processing species enhancing the deposition process or the material layer produced thereby.

In the illustrative PZT deposition process system, the incorporation of the respective elements in the PZT film may also be controlled by other process parameters, such as pressure, oxidizer flow rate, substrate temperature, etc. Such measure of control permits use of the Pb and Ti precursors-containing solution to deposit a $PbTiO_3$ seed layer, which is known to promote formation of the desired perovskite crystal phase, and to discourage the formation of the pyrochlore phase. Once the $PbTiO_3$ film is nucleated, the Zr source can be "turned on" by diverting the gas stream downstream of the "Zr vaporizer" to the deposition chamber from bypass mode, to join the Pb and Ti precursors already flowing to the deposition chamber. At that time the other process conditions may also be altered to achieve the correct stoichiometry in the film which would then be PZT instead of PT, in order to achieve the desired ferroelectric, pyroelectric, or piezoelectric properties.

Referring now to the drawings, FIG. 1 is a schematic representation of a multiple vaporizer liquid delivery system 10 according to one embodiment of the invention, as employed for a deposition of PZT. As used herein, the term "pump" is intended to be broadly construed to include all suitable motive fluid driver means, including, without limitation, pumps, compressors, ejectors, eductors, mass flow controllers, pressure-building circuits, peristaltic drivers, and any other means by which fluid may be conducted through conduit, pipe, line or channel structures.

The system shown in FIG. 1 includes a chemical vapor deposition (CVD) reactor 12 joined by vaporized precursor feed line 26 and branch feed lines 14 and 16 to the respective vaporizer units 18 and 20. Vaporizer unit 18 comprises an interior volume 30 therewithin containing a vaporizer element 22 for effecting vaporization of the liquid precursor flowed to the vaporizer unit for vaporization of the precursor therein to form precursor vapor. In like manner, vaporizer unit 20 comprises an interior volume 32 containing vaporizer element 24 therein for vaporization of the corresponding precursor flowed to vaporizer unit 20.

The vaporizer units 18 and 20 may be constructed and arranged as more fully described in the aforementioned U.S. Pat. No. 5,204,314 issued Apr. 20, 1993 to Peter S. Kirlin et al.; U.S. Pat. No. 5,536,323 issued Jul. 16, 1996 to Peter S. Kirlin et al.; U.S. Pat. No. 5,711,816 issued Jan. 27, 1998 to Peter S. Kirlin, et al.

Vaporizer branch line 14 is provided with flow control valve 74 therein, which may be selectively opened or closed to flow the precursor to the CVD reactor 12 or to terminate the flow of precursor vapor to the reactor by closure of the valve. The vaporizer unit 18 is also coupled to exhaust or bypass line 76 containing flow control valve 78, whereby the flow of precursor vapor may be bypassed from the CVD reactor.

In like manner, vaporizer branch line 16 is provided with flow control valve 80 therein, which is selectively openable or closeable, and vaporizer unit 20 is also coupled to exhaust or bypass line 82 containing flow control valve 84 therein, to flow the precursor to the CVD reactor 12 or to terminate the flow of precursor vapor to the reactor by closure of the valve 80, and opening of valve 84, whereby the flow of precursor vapor 20 may be bypassed from the CVD reactor.

Vaporizer 18 receives liquid precursor in line 34, having pump 36 disposed therein. Line 34 is joined to the mixing manifold 40 in manifold line 38, which receives $Pb(thd)_2$ in the specific embodiment shown from supply vessel 42 joined in liquid flow communication with the mixing manifold 40 by means of supply line 44. The mixing manifold 40 also receives $Ti(Opr)_2(thd)_2$ from supply vessel 46 joined to manifold line 38 by supply line 48, and may receive a third reagent liquid from supply vessel 50 joined to manifold line 38 by supply line 52.

Correspondingly, vaporizer 20 receives liquid precursor solution from line 70 having pump 72 disposed therein, line 70 being joined to the mixing manifold 68 in which $Zr(thd)_4$ flowed in supply line 56 from supply vessel 54 is mixed with a second reagent liquid from supply vessel 58 flowed in supply line 60 to the manifold line 66, and with a third reagent liquid from supply vessel 62 flowed in supply line 64 to the manifold line 66, the second and third reagent streams when provided then flowing in manifold line 66 to the mixing manifold 68.

By this FIG. 1 arrangement, the vaporizer unit 18 receives the Pb and Ti reagent source solutions, and the vaporizer unit 20 receives the Zr reagent source solution. Separate control of the P/T reagents relative to the Z reagent is thereby facilitated, for the purpose of optimizing the PZT film formation process to yield a desired PZT film on the substrate in the CVD reactor The vaporized precursors are flowed from the respective vaporizer units 18 and 20 in line 26 to the CVD reactor, in which the precursor vapor is contacted with the substrate 92 on support or susceptor 94 to deposit a film of the desired character, and with spent precursor vapor being exhausted from the CVD reactor in line 28, for recycle, treatment or other disposition thereof.

As a further variation of such arrangement, it may be desireable in some instances to utilize multiple vaporizer units for the Pb and Ti reagent source solutions, in which a first vaporizer unit receives Pb, Ti source reagent solution containing a relatively higher concentration of Pb reagent and relatively lower concentrationi of Ti reagent, relative to a second vaporizer unit receiving a Pb, Ti source solution containing a lower concentration of Pb reagent and higher concentration of Ti reagent. Such arrangement may be advantageous for the purpose of enhancing control of the product film's stoichiometry.

The use of multiple vaporizers and respective liquid delivery systems as shown in FIG. 1 provides a CVD process system constructed for achieving optimal film properties and minimizing maintenance and reactor cleaning. In the FIG. 1 system, multiple vaporizers are supplied by two separate respective pumps, with multiple reservoirs supplying each pump, with metering of the amounts of the respective precursors from the corresponding reservoirs, for flow of the precursors to a mixing manifold and to the associated specific pump.

FIG. 1 thus shows a multiple vaporizer liquid delivery system, for delivery of precursors to deposit PZT. In operation of the FIG. 1 system, the vaporizer 18 may be maintained at 200° C., and vaporizer 20 may be maintained at 240° C.

Figure 2:
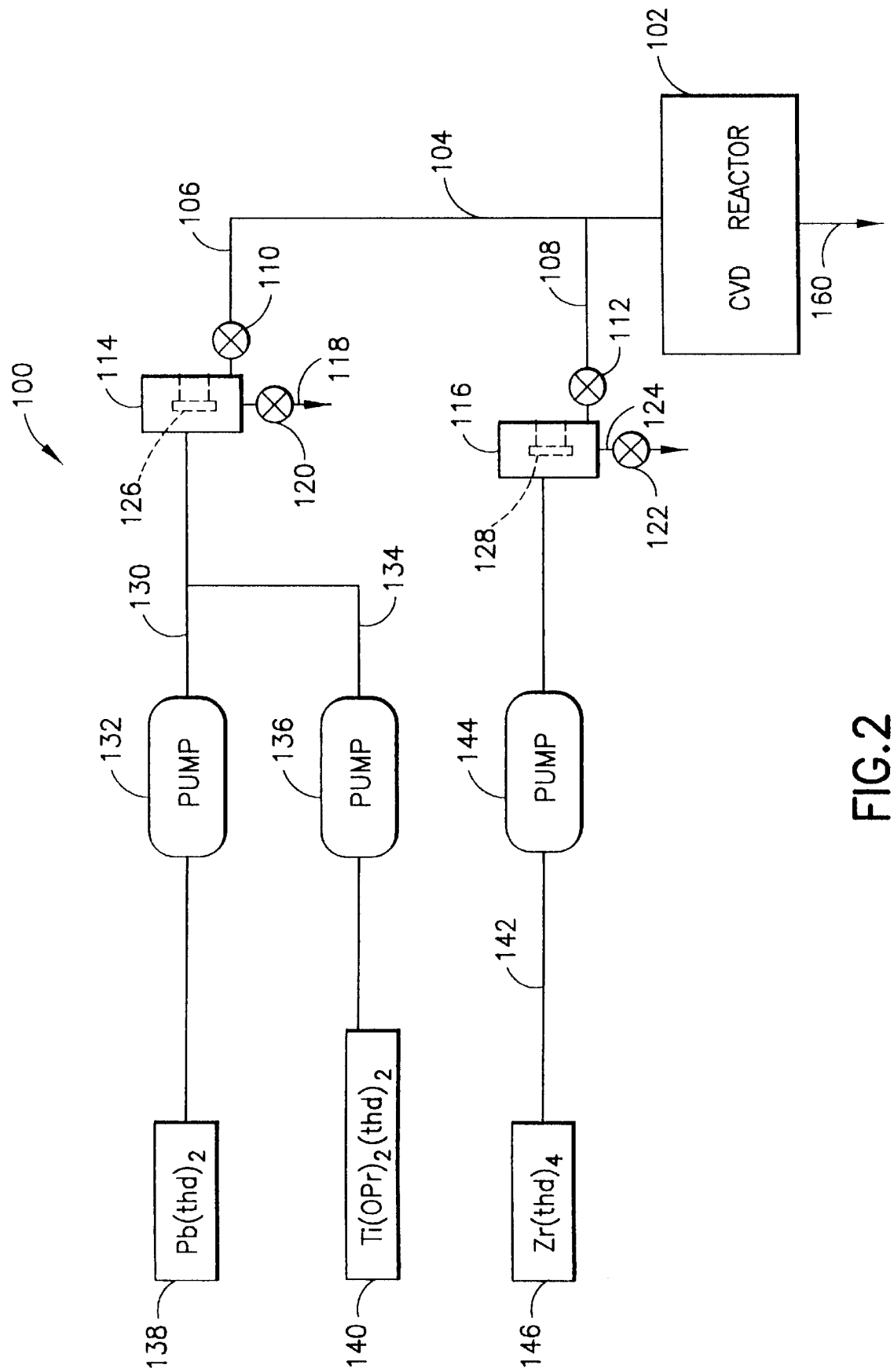
FIG. 2 is a schematic representation of a multiple vaporizer liquid delivery system with a separate pump for each of multiple precursor solutions employed to form a corresponding multicomponent material layer.

FIG. 2 is a schematic representation of multiple vaporizer liquid delivery and deposition system 100 with a separate pump for each of multiple precursor solutions employed to form a corresponding multicomponent material layer.

As illustrated, the deposition system features a CVD reactor 102 joined in precursor vapor feed receiving relationship to vaporizer units 114 and 116, by means of precursor branch lines 106 containing valve 110 therein, and branch line 108 containing valve 112 therein, such branch lines joining main precursor vapor feed line 104.

Vaporizer unit 114 contains vaporizer element 126 and is equipped with a bypass line 118 containing flow control bypass valve 120. Such vaporizer unit receives Pb/Ti precursor solution from supply line 130 containing pump 132, supply line 130 being joined in liquid flow communication with Pb precursor supply vessel 138, and the Ti precursor supply vessel 140 being joined to supply line 130 by branch supply line 134 containing pump 136 therein.

By such arrangement of the Pb and Ti precursor supply vessel, supply lines and pumps, the flow rates of the respective Pb and Ti precursor solutions may be independently varied in relation to one another, to provide a desired ratio of such components to each other, for achieving a desired stoichiometry in the product material layer formed in the CVD reactor.

The vaporizer unit 116 contains the vaporizer element 128 which may be heated by any suitable means, as may the vaporizer elements in the other vaporizer units previously described. Vaporizer unit is coupled to the bypass line 122 containing the flow control valve 124 therein, and receives Zr precursor vapor from supply vessel 146 in supply line 142 containing pump 144 therein.

The CVD reactor may be constructed in a conventional manner, and is provided with exhaust line 160 for discharge of spent precursor vapor from the reactor.

The FIG. 2 multiple vaporizer liquid delivery system thus is arranged with a separate pump for each precursor solution. In the operation of the multiple vaporizers in the FIG. 2 system, the vaporizer 114 may be maintained at 200° C., and the vaporizer 116 may be maintained at a temperature of 240° C.

Figure 3:
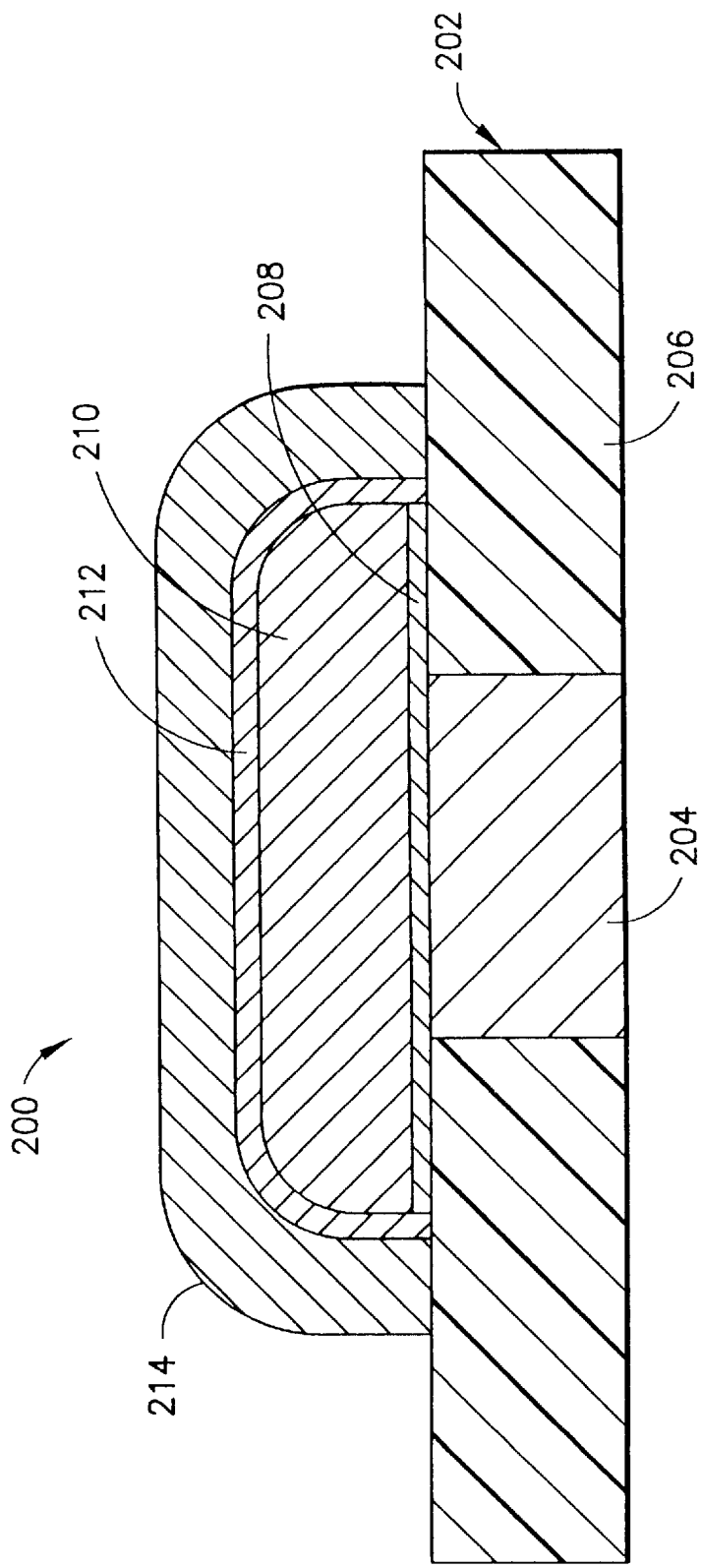
FIG. 3 is a schematic representation of a multiple layer film formed utilizing a multiple step chemical vapor deposition process, employing multiple vaporizers to control gas-phase concentrations.

FIG. 3 is a schematic representation of a multilayer film configuration 200 that can be formed using a multiple step CVD process, utilizing multiple vaporizers to control vapor-phase concentrations with high time-precision.

The FIG. 3 multicomponent material structure comprises a base 202 including a central polysilicon plug 204 surrounded by isolation dielectric material 206. On the base 202 is deposited a conductive barrier layer 208, and a bottom electode layer 210. The bottom electrode layer is coated with a seed layer 212 of $PbTiO_3$ which is deposited using the vaporizer 18 of the FIG. 1 process system, or alternatively the vaporizer 114 of the FIG. 2 system.

On the $PbTiO_3$ layer 212 is deposited a $PbZrTiO_3$ "bulk" layer 214. The bulk layer 214 is deposited using both vaporizers 18 and 20 of the FIG. 1 system, or alternatively using both vaporizers 114 and 116 of the FIG. 2 system.

The illustrative system of the invention in the embodiments of FIGS. 1 and 2 allows or a simple two-step CVD process, where $PbTiO_3$ is deposited first using only a first vaporizer for the Pb/Ti precursor solutions, and then $Pb(Zr,Ti)O_3$ is deposited on top of the first layer by opening the "run valve" on a second vaporizer, to admit Zr precursor vapor from such vaporizer to flow to the CVD reactor.

As a further example, the system of the present invention may advantageously be employed for deposition of $SrBi_2Ta_2O_9$ utilizing metalorganic precursors, to overcome the problem of ligand exchange in the liquid phase for solid precursor components dissolved in liquid solvents. For deposition of $SrBi_2Ta_2O_9$, $Bi(pivalate)_3$ and Bi alkoxides $(Bi(OR)_3)$ are of interest because of their good thermal transport properties, but these compounds undergo rapid ligand exchange in liquid solvents with $Sr(thd)_2$ or $Sr(thd)_2$-lewis base and $Ta(OR)_4thd$ precursors, resulting in the formation of involatile species.

This adverse effect can be avoided by grouping the Sr and Ta precursors together in one liquid delivery system and simultaneously delivering the Bi precursor via a second liquid delivery system, to respective separate vaporizer units. Ligand exchange is slow in the gas phase. Thus, once the precursors are vaporized, they may be mixed before introduction into the deposition chamber.

The deposition of $SrBi_2Nb_2O_9$ is another example in which similar ligand exchange occurs between the Bi precursors and $Sr(thd)_2$ or $Sr(thd)_2$-Lewis base or $Nb(OR)_4thd$. Again, this problem is obviated by grouping the Sr and Nb precursors into one liquid delivery system and simultaneously delivering the Bi precursors via a second liquid delivery system.

Further specific applications of the multiple vaporizer liquid delivery systems of the invention are more fully shown in copending U.S. Pat. No. 5,719,417 issued Feb. 17, 1998 to J. Roeder et al. in the names of Jeff Roeder and Peter Van Buskirk for "Controlled Orientation of Ferroelectric Layers."

Another embodiment of CVD using multiple vaporizers is a single CVD reactor with different deposition regions defined by showerheads or other dispersing orifices, that are each supplied with the gaseous precursor output of one or a set of vaporizers. In this case the substrate would be moved from one deposition zone to another; thin film layers corresponding to the respective gaseous precursor inlets would be deposited sequentially as the substrate moved from one zone to the next.

While the invention has been described herein with respect to illustrative aspects, features and embodiments, it will be appreciated that various alternative aspects, features and embodiments are possible. Accordingly, the invention as hereafter claimed is to be broadly construed, as encompassing all such variations, modifications and other embodiments, within its spirit and scope.

What is claimed is:

1. A system for the deposition of a multicomponent material layer on a substrate from at least two liquid precursors wherein at least two of the liquid precursors have unequal liquid delivery requirements selected from Group 2 of the following two groups:
   (a) Group 1: solubility requirements, solvent requirements, chemical interaction requirements;
   (b) Group 2: temperature of vaporization requirements, method of vaporization requirements, temperature of gas feedline requirements, pressure and ambient carrier gas requirements;
   said system comprising:
   (a) a vapor deposition zone arranged to retain the substrate therein; and
   (b) at least two vaporizer units each of which is joined:
      (i) to at least one liquid precursor source for supplying at least one liquid precursor to a vaporizer unit; and
      (ii) by a gas feedline to the vapor deposition zone for supplying at least one vaporized precursor thereto;
   wherein any two precursors having unequal delivery requirements from Group 1 but not from Group 2 are contained in separate precursor sources; and
   wherein any two precursors having unequal delivery requirements from Group 2 only, or from both Group 1 and Group 2, are deliverable by separate liquid precursor sources wherein each such separate source is individually joined in fluid connection with a separate flash vaporizer.

2. A system according to claim 1, wherein each of the multiple vaporizer units contains a heatable vaporizer element for vaporization of the liquid precursor.

3. A system according to claim 1, wherein at least one of said multiple vaporizer units has multiple sources of liquid precursors joined thereto.

4. A system according to claim 3, wherein a mixing manifold is interposed between the multiple sources of liquid precursors and the vaporizer unit joined thereto.

5. A system according to claim 4, wherein a pump is disposed between the mixing manifold and the vaporizer unit receiving precursor liquid therefrom.

6. A system according to claim 1, wherein a pump is disposed between a source of liquid precursor and the vaporizer unit receiving precursor liquid therefrom.

7. A system according to claim 1, wherein a pump is disposed between each source of liquid precursor and the vaporizer unit receiving precursor liquid therefrom.

8. A system for the deposition of a multicomponent material layer on a substrate, said system comprising:
- at least one liquid precursor source for at least one but less than all components of the multicomponent material layer;
- at least another liquid precursor source for another component of the multicomponent material layer;
- a first vaporizer unit joined in flow communication with the at least one liquid precursor source for at least one but less than all components of the multicomponent material layer;
- a second vaporizer unit joined in flow communication with the at least another liquid precursor source for another component of the multicomponent material layer;
- a vapor deposition unit; and
- the first and second vaporizer units being joined in vapor flow communication with the vapor deposition unit, whereby the vapor deposition unit receives (i) vapor of at least one liquid precursor source for at least one but less than all components of the multicomponent material layer from the first vaporizer unit, and (ii) vapor of at least another liquid precursor source for another component of the multicomponent material layer, for deposition of the multicomponent material layer on a substrate disposed in the vapor deposition unit.

9. A method for depositing of a multicomponent material layer on a substrate from at least two liquid precursors wherein at least two of the liquid precursors have unequal liquid delivery requirements selected from Group 2 of the following two groups:
- (a) Group 1: solubility requirements, solvent requirements, chemical interaction requirements;
- (b) Group 2: temperature of vaporization requirements, method of vaporization requirements, temperature of gas feedline requirements, pressure and ambient carrier gas requirements; comprising:
    - (a) providing any two precursors having unequal delivery requirements from Group 1 or Group 2 in separate precursor sources;
    - (b) flowing any two or more precursors having unequal delivery requirements from Group 1 but not from Group 2 to a single vaporization zone, and vaporizing such precursors to form a precursor;
    - (c) flowing any two or more precursors having unequal delivery requirements selected from Group 2, or from both Group 1 and Group 2, from separate precursor sources to individual separate vaporization zones, wherein each such separate precursor source is individually joined in fluid connection with a separate vaporization zone, and vaporizing such precursors to form an equivalent number of precursor vapors;
    - (d) flowing all vapors from (b) and (c) above to a vapor deposition zone and depositing the multiple component material layer on the substrate.

10. A process according to claim 9, wherein said steps are repetitively carried out to form a multi-layer, multiple component material layer on the substrate.

* * * * *

UNITED STATES PATENT AND TRADEMARK OFFICE
CERTIFICATE OF CORRECTION

PATENT NO. : 5,876,503
DATED : March 2, 1999
INVENTOR(S) : Roeder et al.

It is certified that error appears in the above-identified patent and that said Letters Patent is hereby corrected as shown below:

Column 2, Line 57, change "technologies" to --technologies.--
Column 4, Line 57, change "delivery." to --delivery--.
Column 11, Line 41, change "or" to --for--

Signed and Sealed this

Twenty-first Day of December, 1999

Attest:

Q. TODD DICKINSON

Attesting Officer

Acting Commissioner of Patents and Trademarks